United States Patent
Kang et al.

(10) Patent No.: US 8,987,907 B2
(45) Date of Patent: Mar. 24, 2015

(54) SEMICONDUCTOR DEVICE

(71) Applicant: Samsung Electronics Co., Ltd., Suwon-Si, Gyeonggi-Do (KR)

(72) Inventors: Min-sung Kang, Yongin-si (KR); Se-myeong Jang, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/777,191

(22) Filed: Feb. 26, 2013

(65) Prior Publication Data

US 2013/0241065 A1 Sep. 19, 2013

(30) Foreign Application Priority Data

Mar. 15, 2012 (KR) .................. 10-2012-0026607

(51) Int. Cl.
*H01L 23/48* (2006.01)
*H01L 23/52* (2006.01)
*H01L 29/40* (2006.01)
*H01L 23/522* (2006.01)

(52) U.S. Cl.
CPC .............. *H01L 23/52* (2013.01); *H01L 23/522* (2013.01); *H01L 23/5226* (2013.01)
USPC ..... 257/758; 257/211; 257/760; 257/E23.145

(58) Field of Classification Search
USPC .......... 257/221, 758, 759, 760, 774, E23.145, 257/211
See application file for complete search history.

(56) References Cited

U.S. PATENT DOCUMENTS

| | | | |
|---|---|---|---|
| 6,468,894 B1 * | 10/2002 | Yang et al. ................ | 438/622 |
| 2002/0113317 A1 | 8/2002 | Okushima | |
| 2006/0199368 A1 | 9/2006 | Engelhardt et al. | |
| 2007/0018282 A1 | 1/2007 | Asakawa | |
| 2010/0244254 A1 | 9/2010 | Kobayashi et al. | |

FOREIGN PATENT DOCUMENTS

| | | | |
|---|---|---|---|
| JP | 2006-324388 A | 11/2006 | |
| JP | 2009-246341 A | 10/2009 | |
| KR | 2001-0060038 A | 7/2001 | |
| KR | 2005-0001098 A | 1/2005 | |
| KR | 2007-0018277 A | 2/2007 | |

* cited by examiner

*Primary Examiner* — Hoai V Pham
(74) *Attorney, Agent, or Firm* — Harness, Dickey & Pierce, P.L.C.

(57) ABSTRACT

A semiconductor device may include a semiconductor layer including at least one unit device, a first interconnection on the semiconductor layer and electrically connected to the at least one unit device, a diffusion barrier layer on the first interconnection, an intermetallic dielectric layer on the diffusion barrier layer, a plug in a first region of the intermetallic dielectric layer and passing through the diffusion barrier layer so that a bottom surface thereof contacts the first interconnection, and a first dummy plug in a second region of the intermetallic dielectric layer, passing through the diffusion barrier layer, and disposed apart from the first interconnection so that a bottom surface of the first dummy plug does not contact the first interconnection.

22 Claims, 14 Drawing Sheets

US 8,987,907 B2

SEMICONDUCTOR DEVICE

CROSS-REFERENCE TO RELATED APPLICATIONS

This application claims the benefit of Korean Patent Application No. 10-2012-0026607, filed on Mar. 15, 2012, in the Korean Intellectual Property Office, the disclosure of which is incorporated herein in its entirety by reference.

BACKGROUND

1. Field

Example embodiments of the inventive concepts relate to a semiconductor device, and more particularly, to a semiconductor device including a dummy plug that provides a moving path of hydrogen gas.

2. Description of the Related Art

Recently, research has been actively conducted on various processes of improving electrical characteristics of a semiconductor device. A representative process among these processes is an alloy process of supplying hydrogen and performing a thermal treatment to repair defects in a semiconductor device during a process of forming a unit device or a metal interconnection process. However, as a demand for highly functional and compact semiconductor devices increases, processes of designing and manufacturing a semiconductor device become complicated and finer. Thus, repairing defects in a semiconductor device by using the alloy process may be difficult.

SUMMARY

Example embodiments of the inventive concepts provide a semiconductor device capable of sufficiently securing a moving path of hydrogen gas, thereby improving efficiency of an alloy process and preventing or inhibiting damage to a metal interconnection.

According to example embodiments of the inventive concepts, a semiconductor device may include a semiconductor layer including at least one unit device, a first interconnection on the semiconductor layer and electrically connected to the at least one unit device, a diffusion barrier layer on the first interconnection, an intermetallic dielectric layer on the diffusion barrier layer, a plug in a first region of the intermetallic dielectric layer and passing through the diffusion barrier layer so that a bottom surface thereof contacts the first interconnection, and a first dummy plug in a second region of the intermetallic dielectric layer, passing through the diffusion barrier layer and disposed apart from the first interconnection so that a bottom surface of the first dummy plug does not contact the first interconnection.

A second interconnection may be on the intermetallic dielectric layer, and may contact a top surface of the plug and a top surface of the first dummy plug. The first and second interconnections may overlap each other in the first region of the intermetallic dielectric layer, and the first and second interconnections may not overlap each other in the second region of the intermetallic dielectric layer.

The first dummy plug may provide a moving path of hydrogen gas supplied from an external environment to the semiconductor layer. The bottom surface of the first dummy plug may be flush with the bottom surface of the plug. The bottom surface of the first dummy plug may be lower than the bottom surface of the plug and may be higher than a bottom surface of the first interconnection with respect to the semiconductor layer. The bottom surface of the first dummy plug may be lower than a bottom surface of the first interconnection with respect to the semiconductor layer.

The semiconductor device may further include a second dummy plug in a border region between the first and second regions of the intermetallic dielectric layer and passing through the diffusion barrier layer. A bottom surface of the second dummy plug may be divided into a contact surface that contacts the first interconnection and a non-contact surface that does not contact the first interconnection. The contact surface and the non-contact surface of the second dummy plug may be flush with a top surface of the first interconnection.

The contact surface of the second dummy plug may contact top and side surfaces of the first interconnection, and the non-contact surface of the second dummy plug may be higher than a bottom surface of the first interconnection with respect to the semiconductor layer.

The semiconductor device may further include a third dummy plug in a border region between the first and second regions of the intermetallic dielectric layer, and passing through the diffusion barrier layer. A bottom surface of the third dummy plug may be exposed and a side surface of the third dummy plug may contact a side surface of the first interconnection.

The first dummy plug may include a material used to form the plug. The first dummy plug may include a cross-section having one of a circular, oval, and polygonal shape. The first dummy plug may be formed in a line shape extending in a horizontal direction.

According to example embodiments of the inventive concepts, a semiconductor device may include a semiconductor layer including at least one unit device, a first interconnection on the semiconductor layer and electrically connected to the at least one unit device, a first diffusion barrier layer on the first interconnection, a first intermetallic dielectric layer on the first diffusion barrier layer, a second interconnection on the first intermetallic dielectric layer, a second diffusion barrier layer on the second interconnection, a second intermetallic dielectric layer on the second diffusion barrier layer, a first plug in a first region of the first intermetallic dielectric layer, passing through the first diffusion barrier layer, and having a bottom surface contacting the first interconnection and a top surface contacting the second interconnection, a second plug in a first region of the second intermetallic dielectric layer, passing through the second diffusion barrier layer, and having a bottom surface contacting the second interconnection, and a first dummy plug in a second region of the second intermetallic dielectric layer, passing through the second diffusion barrier layer, and disposed apart from the second interconnection so that a bottom surface of the first dummy plug does not contact the second interconnection.

The first dummy plug may pass through the first diffusion barrier layer.

According to example embodiments of the inventive concepts, a semiconductor device may include a first interconnection on a semiconductor layer, a diffusion barrier layer on the first interconnection, an intermetallic dielectric layer on the diffusion barrier layer, a plug in a first region of the intermetallic dielectric layer, the plug passing through the diffusion barrier layer so that a bottom surface thereof contacts the first interconnection, and a first dummy plug in a second region of the intermetallic dielectric layer, the first dummy plug passing through the diffusion barrier layer so that a bottom surface of the first dummy plug is exposed.

The semiconductor device may further include a second interconnection on the intermetallic dielectric layer and contacting a top surface of the plug and a top surface of the first dummy plug. The first and second interconnections may overlap each other in the first region of the intermetallic dielectric layer, and the first and second interconnections may not overlap each other in the second region of the intermetallic dielectric layer.

The semiconductor device may further include a second dummy plug in a border region between the first and second regions of the intermetallic dielectric layer and passing through the diffusion barrier layer. A bottom surface of the second dummy plug may be divided into a contact surface that contacts the first interconnection and a non-contact surface that does not contact the first interconnection. The contact surface and the non-contact surface of the second dummy plug may be flush with a top surface of the first interconnection. The contact surface of the second dummy plug may contact top and side surfaces of the first interconnection, and the non-contact surface of the second dummy plug may be higher than a bottom surface of the first interconnection with respect to the semiconductor layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
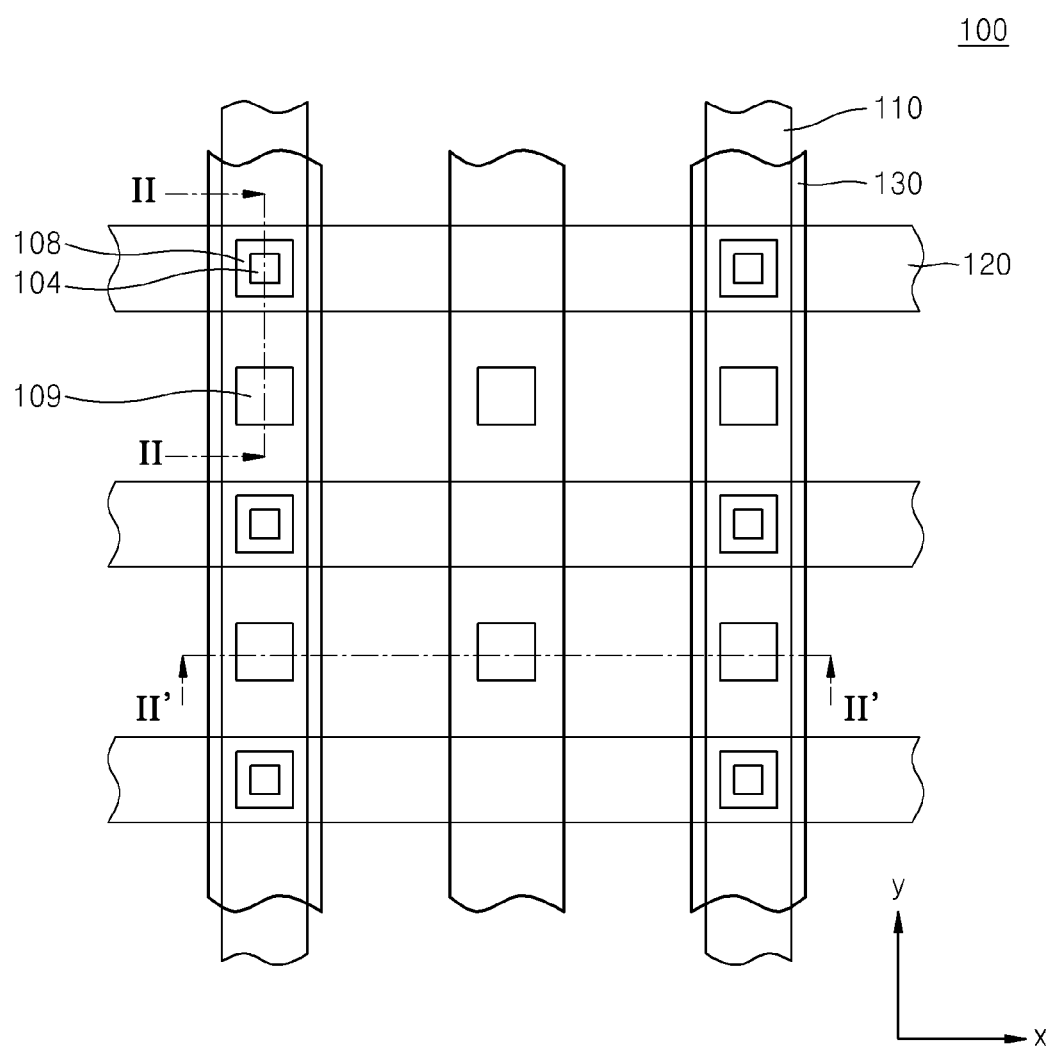
FIG. 1 is a conceptual diagram illustrating a layout of a part of a semiconductor device according to example embodiments of the inventive concepts.

Hereinafter, the inventive concepts will be described more fully with reference to the accompanying drawings, in which example embodiments of the inventive concepts are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those of ordinary skilled in the art. The same reference numerals represent the same elements throughout the drawings. In the drawings, lengths and sizes of layers and regions may be exaggerated for clarity.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

The terminology used herein is for the purpose of describing particular embodiments only and is not intended to be limiting of the inventive concepts. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When example embodiments of the inventive concepts may be modified, for example, a process may be performed differently than described. For example, actually, processes that are described as being sequentially performed may be simultaneously performed or may be performed differently than described.

As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a conceptual diagram illustrating a layout of a part of a semiconductor device 100 according to example embodiments of the inventive concepts. For convenience of explanation, FIG. 1 illustrates only a part of the semiconductor device 100, in which a plurality of bit lines 110 formed on a semiconductor layer (not shown), a plurality of first interconnections 120, and a plurality of second interconnections 130 are arranged.

Referring to FIG. 1, the bit lines 110 extend in a first direction (a y-axis direction) and may be aligned with one another in a second direction (an x-axis direction) on the semiconductor layer. Although FIG. 1 illustrates that the first and second directions are perpendicular to each other, the inventive concepts are not limited thereto and the first and second directions are not limited provided that they are different from each other. The bit lines 110 may be electrically connected to unit devices (not shown) included in the semiconductor layer via a direct contact plug (not shown).

The first interconnections 120 may extend in the second direction and may be aligned with one another in the first direction. The first interconnections 120 may be electrically connected to the bit lines 110 via a bit line contact plug 104 therebetween. The bit line contact plug 104 may be disposed at each intersection of the first interconnections 120 and the bit lines 110.

The second interconnections 130 may extend in the first direction and may be aligned with one another in the second direction. The second interconnections 130 may be electrically connected to the first interconnections 120 via a plug 108 therebetween. The plug 108 may be disposed at each intersection of the second interconnections 130, the first interconnections 120, and the bit lines 110. For example, the plug 108 may be disposed at a location corresponding to the location of the corresponding bit line contact plug 104.

Each of the second interconnections 130 may be connected to first dummy plugs 109. Each of the first dummy plugs 109 may be disposed in a region where one of the second interconnections 130 and one of the first interconnections 120 do not overlap with each other. In other words, each of the first dummy plugs 109 may be disposed in an area where a first interconnection dielectric layer (not shown), which separates the first interconnections 120 from one another, is formed and each of the second interconnections 130 overlap with each other.

Although FIG. 1 illustrates that each of the bit line contact plugs 104, the plugs 108, and the first dummy plugs 109 has a rectangular planar shape, the inventive concepts are not limited thereto. FIG. 1 illustrates a case where the first interconnections 120 are perpendicular to the bit lines 110 and the second interconnections 130 are arranged in the direction in which the bit lines 110 are arranged, but the inventive concepts are not limited thereto. Furthermore, FIG. 1 illustrates a case where the first interconnections 120 and the second interconnections 130 have the same line width and are disposed at the same interval, but the inventive concepts are not limited thereto. This also applies to FIGS. 7, 9, and 12.

Figure 2:
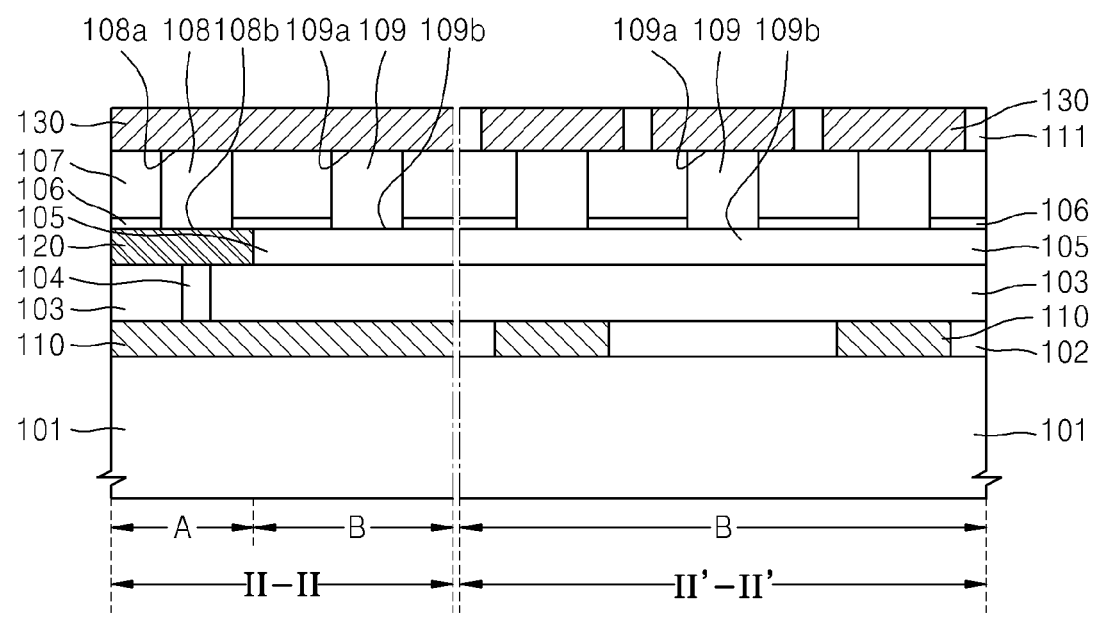
FIG. 2 is a side cross-sectional view taken along lines II-II and II'-II' of FIG. 1.

FIG. 2 is a side cross-sectional view taken along lines II-II and II'-II' of FIG. 1. In FIG. 2, the part indicated by the line II-II is a cross-sectional view obtained when the semiconductor device 100 of FIG. 1 is cut in the y-axis direction, and the part indicated by the line II'-II' is a cross-sectional view obtained when the semiconductor device 100 is cut in the x-axis direction.

Referring to FIGS. 1 and 2, the bit lines 110 and a bit line insulating layer 102 may be formed on a semiconductor layer 101. Although not shown, the semiconductor layer 101 may include a substrate and at least one unit device formed on the substrate. The substrate may include, for example, a semiconductor material, e.g., silicon or silicon-germanium, and may include an epitaxial layer, a silicon-on-insulator (SOI) layer, or a semiconductor-on-insulator (SeOI) layer. The at least one unit device may be any of various types of active devices, e.g., MOS transistors, which are needed to manufacture the semiconductor device 100. Otherwise, the at least one unit device may be a memory device, e.g., dynamic random access memory (DRAM), static RAM (SRAM), flash memory, resistive RAM (RRAM), phase RAM (PRAM), magnetic RAM (MRAM), or spin-transfer-torque MRAM (STT-MRAM).

The bit lines 110 may extend within the bit line insulating layer 102 in the first direction. However, the inventive concepts are not limited thereto and the bit lines 110 may be embedded in the substrate of the semiconductor layer 101, according to example embodiments of the at least one unit device on the substrate. For example, if the at least one unit device is an embedded DRAM cell, the bit lines 110 may be embedded in the substrate. The bit line insulating layer 102 may contain a silicon nitride (SiN) and/or a silicon oxynitride (SiON).

The bit lines 110 may be electrically connected to the at least one unit device via the direct contact plug. For example, if the at least one unit device is DRAM, the direct contact plug may be disposed between the bit lines 110 and a source and/or drain region of the DRAM to electrically connect the bit lines 110 and the at least one unit device. The bit lines 110 and the direct contact plug may each contain a conductive material, e.g., doped poly silicon, aluminum (Al), tungsten (W), copper (Cu), or titanium (Ti).

An interlayer dielectric layer 103 including the bit line contact plug 104 may be formed on the bit lines 110 and the bit line insulating layer 102. The bit line contact plug 104 may be disposed between the bit lines 110 and the first interconnections 120 to electrically connect the bit lines 110 and the first interconnections 120. A contact pad (not shown) may be disposed on an interface between the bit line contact plug 104 and the first interconnection 120. Similarly, each of the plug 108 and the first dummy plug 109, which are described in detail below, may also be electrically connected to corresponding interconnections via a pad. The bit line contact plug 104 may contain a conductive material, e.g., doped poly silicon, metal, or a metal nitride.

The interlayer dielectric layer 103 may have a single-layered structure or a multi-layered structure. The interlayer dielectric layer 103 may be formed of boron phosphorus silicate glass (BPSG), tonen silazene (TOSZ), undoped silicate glass (USG), spin-on glass (SOG), a flowable oxide (FOX), tetraethyl orthosilicate (TEOS), a high-density plasma chemical vapor deposition (HDP CVD) oxide, or hydrogen silsesquioxane (HSQ). Optionally, the interlayer dielectric layer 103 may further contain a silicon nitride.

The first interconnection 120 may be formed on the interlayer dielectric layer 103. The first interconnection 120 may be divided by a first interconnection dielectric layer 105. The first interconnection 120 may be formed of at least one metallic material selected from the group consisting of copper (Cu), aluminum (Al), tungsten (W), titanium (Ti), a titanium nitride (TiN), a tungsten nitride (WN), tantalum (Ta), a tantalum nitride (TaN), and a titanium-aluminum nitride (TiAlN). The first interconnection 120 may be electrically connected to the at least one unit device via the bit line contact plug 104. The first interconnection dielectric layer 105 may be formed of the material used to form the interlayer dielectric layer 103.

Although FIG. 2 illustrates that the first interconnection dielectric layer 105 is formed separately from the interlayer dielectric layer 103, the inventive concepts are not limited thereto. The first interconnection dielectric layer 105 may be integrally formed with the interlayer dielectric layer 103. For example, when a dual damascene process is used to form the first interconnection 120 of copper (Cu), the first interconnection dielectric layer 105 may be integrally formed with the interlayer dielectric layer 103.

A diffusion barrier layer 106 may be formed on the first interconnection 120 and the first interconnection dielectric layer 105. The diffusion barrier layer 106 may prevent or inhibit diffusion of metallic material, which is used to form the first interconnection 120, during the manufacture of the semiconductor device 100. The diffusion barrier layer 106 may be formed to cover top surfaces of the first interconnection 120 and the first interconnection dielectric layer 105. Otherwise, although not shown in FIG. 2, the diffusion barrier layer 106 may be formed to cover bottom surfaces of the first interconnection 120 and the first interconnection dielectric layer 105. The diffusion barrier layer 106 may have a single-layered structure or a multi-layered structure. The diffusion barrier layer 106 may be formed of at least one material selected from the group consisting of titanium (Ti), tantalum (Ta), cobalt (Co), a titanium nitride (TiN), a tantalum nitride (TaN), and a cobalt nitride (CoN), but the inventive concepts are not limited thereto.

An intermetallic dielectric layer 107, including the plug 108 and the first dummy plug 109, may be formed on the diffusion barrier layer 106. The second interconnection 130 may be formed on the intermetallic dielectric layer 107.

The plug 108 may be disposed in the intermetallic dielectric layer 107 in a region (first region A) in which the first interconnection 120 and the second interconnection 130 overlap each other. The plug 108 may have a top surface 108a contacting a bottom surface of the second interconnection 130 and a bottom surface 108b contacting the top surface of the first interconnection 120, and may extend to pass through the intermetallic dielectric layer 107 and the diffusion barrier layer 106. The plug 108 may be formed of a conductive material, e.g., at least one material selected from the group consisting of aluminum (Al), copper (Cu), an aluminum-copper (Al—Cu) alloy, tungsten silicide (WSi), a titanium tungsten oxide (TiW), tantalum (Ta), molybdenum (Mo), and tungsten (W). Thus, the plug 108 may electrically connect the first interconnection 120 and the second interconnection 130. A width of the plug 108 may be equal to or greater than that of the bit line contact plug 104. The plug 108 may have a cross-section having a circular, oval, or polygonal shape.

The first dummy plug 109 may be disposed in the intermetallic dielectric layer 107 in a region (second region B) in which the first interconnection 120 and the second interconnection 130 do not overlap with each other. The second region B may include both a region in which the first interconnection 120 is not present below the intermetallic dielectric layer 107 and a region in which the second interconnection 130 is present on the intermetallic dielectric layer 107. The second region B is not limited to a part of the semiconductor device 100. A bottom surface 109b of the first dummy plug 109 may be disposed on a plane where the bottom surface 108b of the plug 108 is disposed but does not contact the first interconnection 120. In other words, the first dummy plug 109 may have a top surface 109a contacting the bottom surface of the second interconnection 130 and the bottom surface 109b contacting the top surface of the first interconnection dielectric layer 105, and may extend to pass through the intermetallic dielectric layer 107 and the diffusion barrier layer 106. The first dummy plug 109 may be formed of the material used to form the plug 108. Although FIG. 2 illustrates that the first dummy plug 109 has the same width as that of the plug 108, the inventive concepts are not limited thereto. The first dummy plug 109 may have a width that is different from that of the plug 108. The first dummy plug 109 may have a cross-section having any of various shapes. The first dummy plug 109 is described in detail with reference to FIGS. 3 to 5 below.

The intermetallic dielectric layer 107 may have a single-layered structure or a multi-layered structure and may be formed of the material used to form the interlayer dielectric layer 103. In particular, the intermetallic dielectric layer 107 may be formed of a hydrogen-containing dielectric material, e.g., HSQ, TEOS, or HDP CVD oxide. In example embodiments, as will be described below, the intermetallic dielectric layer 107 may allow smooth flow of a hydrogen gas $H_2$ (see FIG. 3). Optionally, the intermetallic dielectric layer 107 may further contain a silicon nitride.

The second interconnection 130 may be divided by a second interconnection dielectric layer 111. The second interconnection 130 may be formed of the material used to form the first interconnection 120. The second interconnection 130 may be electrically connected to the first interconnection 120 via the plug 108, and may thus be electrically connected to the at least one unit device. The second interconnection dielectric layer 111 may be formed of the material used to form the interlayer dielectric layer 103 or the material used to form the first interconnection dielectric layer 105.

Figure 3:
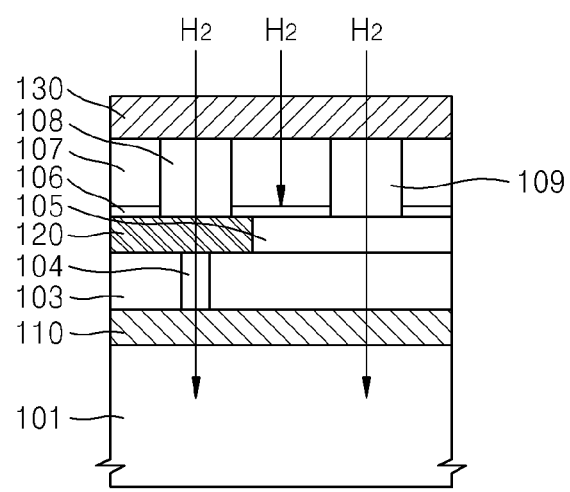
FIG. 3 is a side cross-sectional view for explaining a function of a dummy plug according to example embodiments of the inventive concepts.

FIG. 3 is a side cross-sectional view for explaining a function of the dummy plug 109 according to example embodiments of the inventive concepts. FIG. 3 illustrates a case where hydrogen gas $H_2$ is supplied after the first interconnection 120 and the second interconnection 130 of FIG. 1 are formed, but the inventive concepts are not limited thereto and hydrogen gas $H_2$ may be supplied before the second interconnection 130 is formed.

Electrical characteristics of a semiconductor device may be degraded due to a defect occurring in a unit device included therein during manufacture of the semiconductor device, e.g., an oxidization process or a plasma etch process. For example, a dangling bond may be formed on an interface between a silicon oxide layer of the unit device and a silicon substrate or an interface between a gate oxide layer of the unit device and the silicon substrate. Thus, an amount of leakage current increases to thus degrade the electrical characteristics of the semiconductor device.

In order to improve the electrical characteristics of the semiconductor device by repairing a defect, e.g., the dangling bond, an alloy process may be performed to supply hydrogen gas $H_2$ to the semiconductor device and perform annealing on the semiconductor device. Hydrogen gas $H_2$ may be sufficiently supplied to the unit device having the defect or such interfaces so as to improve the efficiency of the alloy process. However, flow of the hydrogen gas $H_2$ is interrupted by a diffusion barrier layer formed to cover a top surface and/or bottom surface of an interconnection to prevent or inhibit a defect from occurring due to diffusion of metallic materials of the interconnection. As described above, a moving path of hydrogen gas $H_2$ is not secured, and such a defect may not be repaired, thereby degrading an efficiency of the alloy process. Process temperature and pressure should be lowered to supply high-density hydrogen gas $H_2$ so as to improve the efficiency of the alloy process. However, in example embodiments, stress may be applied onto the interconnection to thus degrade the reliability of the interconnection.

Referring to FIG. 3, in the semiconductor device 100, a moving path of hydrogen gas $H_2$ may be interrupted by the diffusion barrier layer 106 covering the top surface of the first interconnection 120. The first dummy plug 109 may extend to pass through the diffusion barrier layer 106 so that the bottom surface 109b thereof may be exposed via the diffusion barrier layer 106, thereby providing the moving path of hydrogen gas $H_2$. Thus, in the semiconductor device 100, not only the plug 108 that passes through the diffusion barrier layer 106 and contacts the first interconnection 120 but also the first dummy plug 109 may provide a moving path of hydrogen gas $H_2$. For this reason, hydrogen gas $H_2$ may be sufficiently supplied to fix defects in the semiconductor device 100. Accordingly, the efficiency of the alloy process may be improved, and thus, the electrical characteristics of the semiconductor device 100 may be improved. Furthermore, the moving path of hydrogen gas $H_2$ may be sufficiently secured by using the first dummy plug 109. Thus, high-density hydrogen gas $H_2$ does not need to be supplied by changing the process temperature and pressure. Accordingly, it is possible to improve the reliability of interconnections in the semiconductor device 100.

Figure 4A:
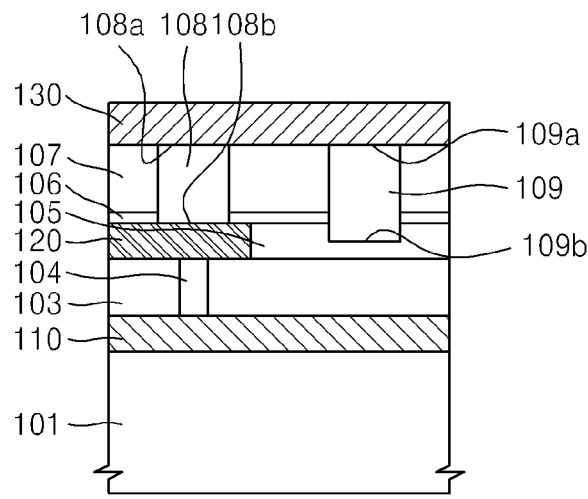
FIGS. 4A and 4B are side cross-sectional views illustrating depths of first dummy plugs according to example embodiments of the inventive concepts.
Figure 4B:
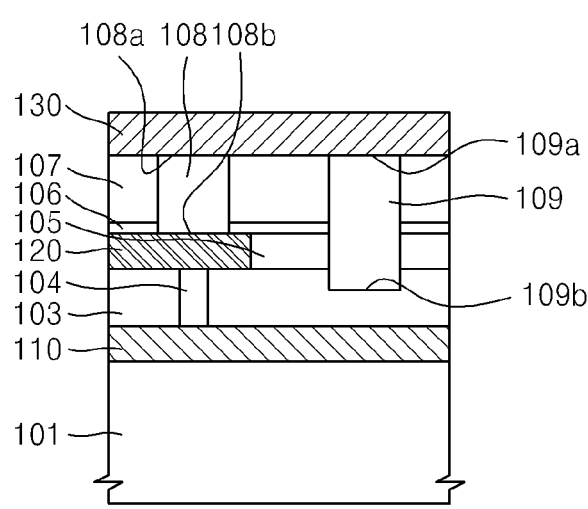
Figure 5:
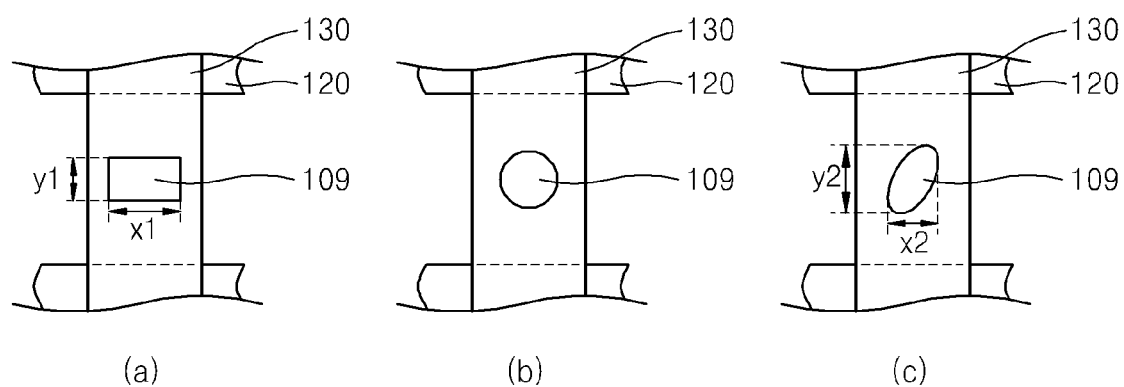
FIGS. 5(a)-5(c) are plan views of first dummy plugs according to example embodiments of the inventive concepts.

FIGS. 4A and 4B are side cross-sectional views illustrating depths of first dummy plugs 109 according to example embodiments of the inventive concepts. Referring back to FIGS. 2 and 3, the bottom surface 109b of the first dummy plug 109 is disposed on the plane where the bottom surface of the plug 108 is disposed, and the bottom surface 109b of the first dummy plug 109 may be exposed via a lower side of the diffusion barrier layer 106, but the inventive concepts are not limited thereto.

As illustrated in FIG. 4A, a bottom surface 109b of the first dummy plug 109 may be lower than a bottom surface 108b of a plug 108 and may be higher than a bottom surface of a first interconnection 120 with respect to the semiconductor layer 101. In other words, the bottom surface 109b of the first dummy plug 109 may be embedded in a first interconnection dielectric layer 105.

Referring to FIG. 4B, a bottom surface 109b of the first dummy plug 109 may be lower than a bottom surface of a first interconnection 120 with respect to the semiconductor layer 101. That is, the bottom surface 109b of the first dummy plug 109 may be embedded in an interlayer dielectric layer 103. In example embodiments, the bottom surface 109b of the first dummy plug 109 may not contact a bit line 110.

In the embodiments of FIGS. 4A and 4B, the first dummy plug 109 extends to pass through the diffusion barrier layer 106 so as to provide a moving path of hydrogen gas $H_2$ and smoothly supply the hydrogen gas $H_2$ to repair defects in the semiconductor layer 101.

FIGS. 5(a)-5(c) are plan views of first dummy plugs 109 according to example embodiments of the inventive concepts. In particular, FIGS. 5(a)-5(c) are detailed plan views of the first dummy plug 109 formed in the intermetallic dielectric layer 107 illustrated in FIG. 2, 3, or 4.

Referring to FIG. 5(a), optionally, the first dummy plug 109 may have a rectangular cross-section, the lengths of two sides of which are different from each other. FIG. 5(a) illustrates that an x-axis length x1 of the first dummy plug 109 is greater than a y-axis length y1 thereof, but the x-axis length x1 may be less than the y-axis length y1. In FIG. 5(a), two joining sides of the first dummy plug 109 having the rectangular cross-section are respectively disposed in the x-axis direction and the y-axis direction, but are not limited thereto provided that they are perpendicular to each other. Otherwise, two joining sides of the first dummy plug 109 may intersect at a predetermined or given angle with respect to the x-axis and the y-axis.

Referring to FIG. 5(b), the first dummy plug 109 may have a circular cross-section having the same diameter in all directions. Otherwise, referring to FIG. 5(c), the first dummy plug 109 may have an oval cross-section, in which a diameter varies. Referring to FIG. 5(c), a y-axis diameter x2 is longer than an x-axis diameter y2, but the x-axis diameter x2 may be longer than the y-axis diameter y2. Although FIG. 5(c) illustrates that a long axis and a short axis of the oval cross-section are respectively an x-axis and a y-axis, the example embodiments are not limited thereto provided that the long axis and the short axis are perpendicular to each other.

Similar to as illustrated in FIGS. 5(a) to (c), the direct contact plug, the bit line contact plug 104, and the plug 108 according to the previous example embodiments may each have a cross-section having any of various shapes. Also, a second plug 214 and a second dummy plug 215 of FIG. 12 may each have a cross-section having any of various shapes.

FIGS. 6A to 6E are side cross-sectional views sequentially illustrating a method of manufacturing the semiconductor device 100, according to example embodiments of the inventive concepts. In particular, FIGS. 6A to 6D are cross-sectional views taken along the lines II-II and II'-II' of FIG. 1, as illustrated in FIG. 2. However, the inventive concepts are not limited to the method of FIGS. 6A to 6E.

Figure 6A:
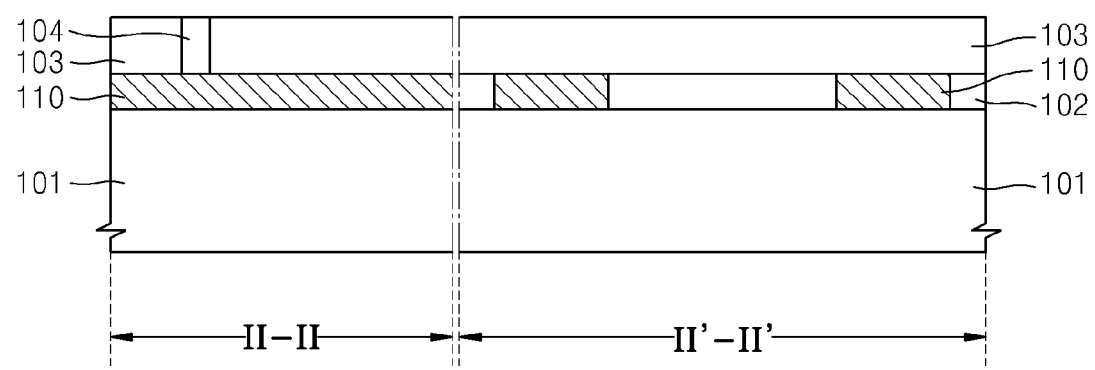
FIGS. 6A to 6E are side cross-sectional views sequentially illustrating a method of manufacturing the semiconductor device of FIG. 1, according to example embodiments of the inventive concepts.

Referring to FIG. 6A, a semiconductor layer 101 is formed by forming unit devices on a substrate (not shown), and bit lines 110 and a bit line insulating layer 102 are formed on the semiconductor layer 101. A material that may be used to form the bit lines 110 is as described above.

The bit lines 110 may be formed by forming a bit line material layer by CVD, physical vapor deposition (PVD), or atomic layer deposition (ALD), and then patterning the bit line material layer by photolithography. Spaces between the bit lines 110 may be filled with a bit line insulating material as described above, and the resultant structure may be planarized by etching or chemical mechanical polishing (CMP). Then, the bit lines 110 are separated from one another by forming a bit line insulating layer 102.

Otherwise, when copper (Cu) is used to form the bit lines 110, a damascene process or a dual damascene process may be used. The bit lines 110 may have different or the same widths. In particular, in order to secure an alignment margin of the bit lines 110 that contact a bit line contact plug 104, the bit lines 110 may be formed in such a manner that parts of the bit lines 110 contacting the bit line contact plug 104 may each have a larger width than those of the other parts.

Then, an interlayer dielectric layer 103 including the bit line contact plug 104 is formed on the bit lines 110 and the bit line insulating layer 102. A material that may be used to form the interlayer dielectric layer 103 and a material that may be used to form the bit line contact plug 104 are as described above.

The interlayer dielectric layer 103 may be formed by CVD, PVD, e.g., sputtering, or ALD. The bit line contact plug 104 may be obtained by forming a photoresist pattern (not shown), etching an exposed part of the interlayer dielectric layer 103 by using the photoresist pattern as a mask to form a contact hole, and filling the contact hole with the conductive material described above with respect to CVD, PVD, or ALD, and planarizing the resultant structure by CMP or etch back.

Figure 6B:
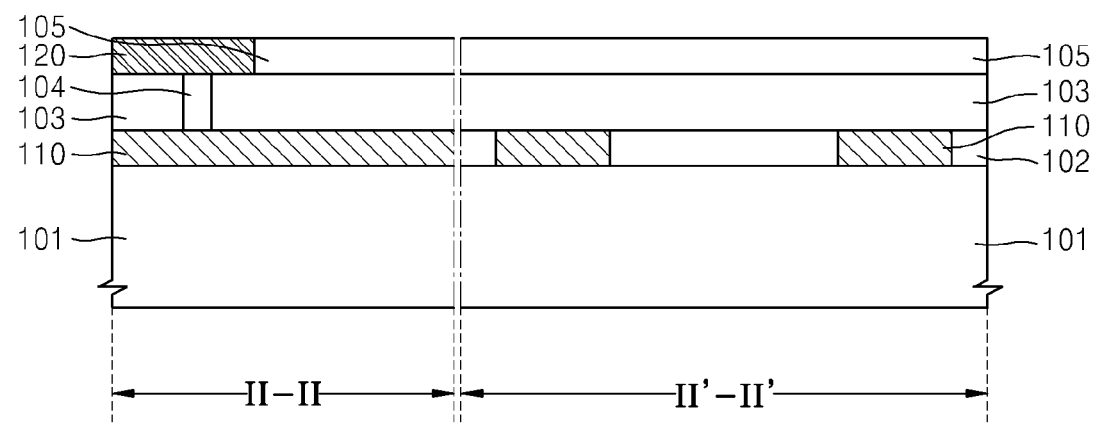

Referring to FIG. 6B, first interconnections 120 are formed on the interlayer dielectric layer 103. A material that may be used to form the first interconnections 120 is as described above. Before the first interconnections 120 are formed, a diffusion barrier layer (not shown) may be formed to cover an upper portion of the interlayer dielectric layer 103.

The first interconnections 120 may be obtained by forming a first interconnection material layer by CVD, PVD, e.g., sputtering, or ALD and patterning the first interconnection material layer by photolithography. Spaces between the first interconnections 120 may be filled with an insulating material as described above and then be planarized by etching or CMP. Thus, the first interconnections 120 are separated from one another by forming a first interconnection dielectric layer 105.

Otherwise, when copper (Cu) is used to form the first interconnections 120, a damascene process or a dual damascene process may be performed to embed copper (Cu) in the interlayer dielectric layer 103. In example embodiments, the first interconnection dielectric layer 105 may be integrally formed with the interlayer dielectric layer 103.

The first interconnections 120 may have different or the same widths. In particular, parts of the first interconnections 120 that contact a first plug 108 may each have a larger width than those of the other parts so as to secure an alignment margin of the first interconnections 120 that contact the first plug 108. Also, the first interconnections 120 may be separated from one another to have the same or different pitches.

Figure 6C:
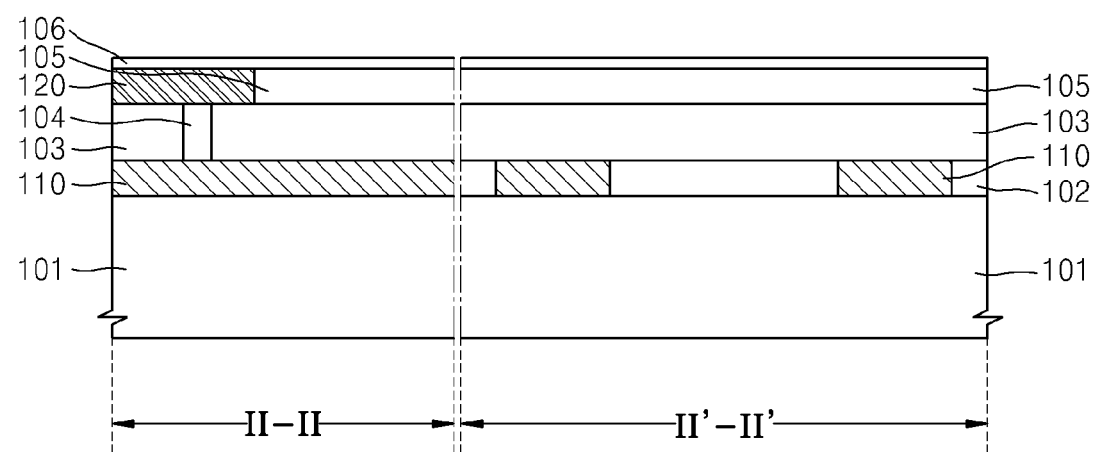

Referring to FIG. 6C, a diffusion barrier layer 106 is formed on the first interconnections 120 and the first interconnection dielectric layer 105. A material that may be used to form the diffusion barrier layer 106 is as described above. The diffusion barrier layer 106 may be formed by CVD, PVD, e.g., sputtering, or ALD.

Figure 6D:
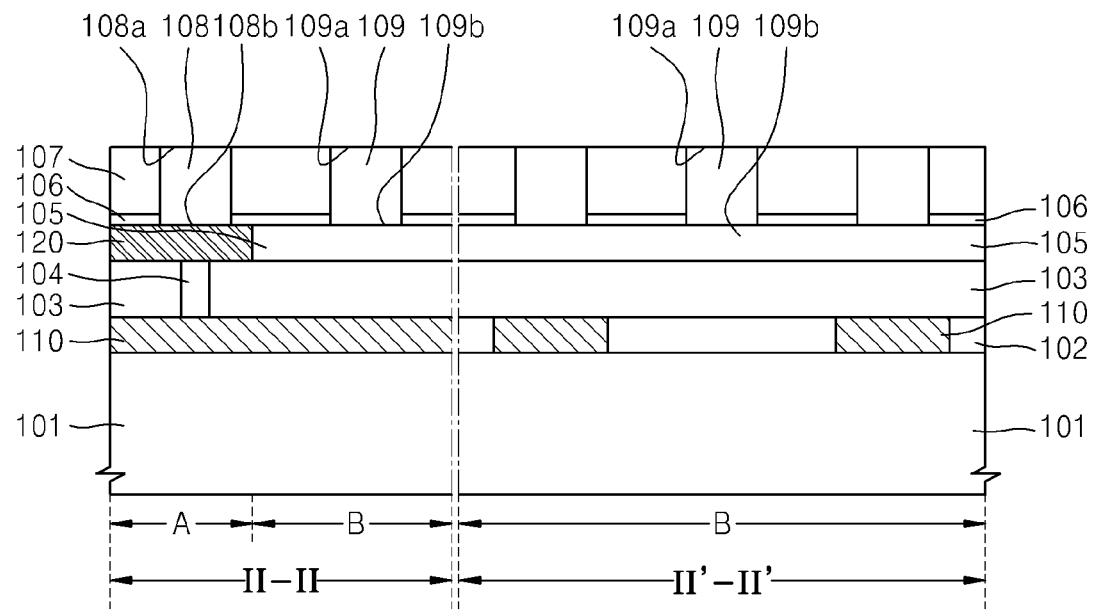

Referring to FIG. 6D, an intermetallic dielectric layer 107, including the plug 108 and a first dummy plug 109, is formed on the diffusion barrier layer 106. A material that may be used to form each of the plug 108, the first dummy plug 109, and the intermetallic dielectric layer 107 is as described above.

The intermetallic dielectric layer 107 may be formed by CVD, PVD, e.g., sputtering, or ALD. Holes for forming the plug 108 and the first dummy plug 109 may be formed by forming a photoresist pattern (not shown) on the intermetallic dielectric layer 107 and etching an exposed part of the intermetallic dielectric layer 107 to a predetermined or given depth by using the photoresist pattern as a mask. Hereinafter, a hole for forming the plug 108 and a hole for forming the first dummy plug 109 will be referred to as a 'first hole' and a 'second hole', respectively. The first hole may be formed in the intermetallic dielectric layer 107 in a first region A in which the first interconnection 120 and the second interconnection 130 overlap each other. The second hole may be formed in the intermetallic dielectric layer 107 in a second region B in which the first interconnection 120 and the second interconnection 130 do not overlap each other.

The first and second holes may have the same width. For example, the photoresist pattern may be formed and the exposed part of the intermetallic dielectric layer 107 may be etched to a predetermined or given depth by using the photoresist pattern as a mask so that the first hole and the second hole may have the same width. However, the inventive concepts are not limited thereto and the first and second holes may have different widths.

The intermetallic dielectric layer 107 and the diffusion barrier layer 106 may be etched in such a manner that the first and second holes may have the same depth. The first hole may be obtained by etching the intermetallic dielectric layer 107 until a top surface of the first interconnection 120 is exposed, and the second hole may be obtained by etching the diffusion barrier layer 106 until a top surface of the first interconnection dielectric layer 105 is exposed. Otherwise, the intermetallic dielectric layer 107 and the diffusion barrier layer 106 may be etched in such a manner that the first hole and the second hole may have different depths. For example, the second hole may be obtained by further etching the diffusion barrier layer 106 until the first interconnection dielectric layer 105 may be recessed to a predetermined or given depth or so that the first interconnection dielectric layer 105 may be passed through. In example embodiments, because the same material or different materials may be used to form the first intermetallic dielectric layer 107, the interconnection dielectric layer 105, and the interlayer dielectric layer 103, timed etching may be performed to form the first and second holes so that the intermetallic dielectric layer 107 and the diffusion barrier layer 106 may be etched to desired depths.

The first hole and the second hole may be formed together according to a single process as described above but may be individually formed by individually performing patterning and etching for the first and second holes.

The plug 108 and the first dummy plug 109 may be formed by filling the first hole and the second hole with a conductive material by CVD, PVD or ALD and planarizing the resultant structures by CMP or etch back.

As described above, the semiconductor device 100 may be manufactured in such a manner that a dummy plug for providing a moving path of hydrogen gas $H_2$ may be formed during formation of an intermetallic contact plug. Thus, any additional process does not need to be performed so as to provide the moving path of hydrogen gas $H_2$ after a metal interconnection process is completed. Accordingly, the semiconductor device 100 may be manufactured in a simple manner to improve the efficiency of an alloy process while saving manufacturing costs thereof.

Figure 6E:
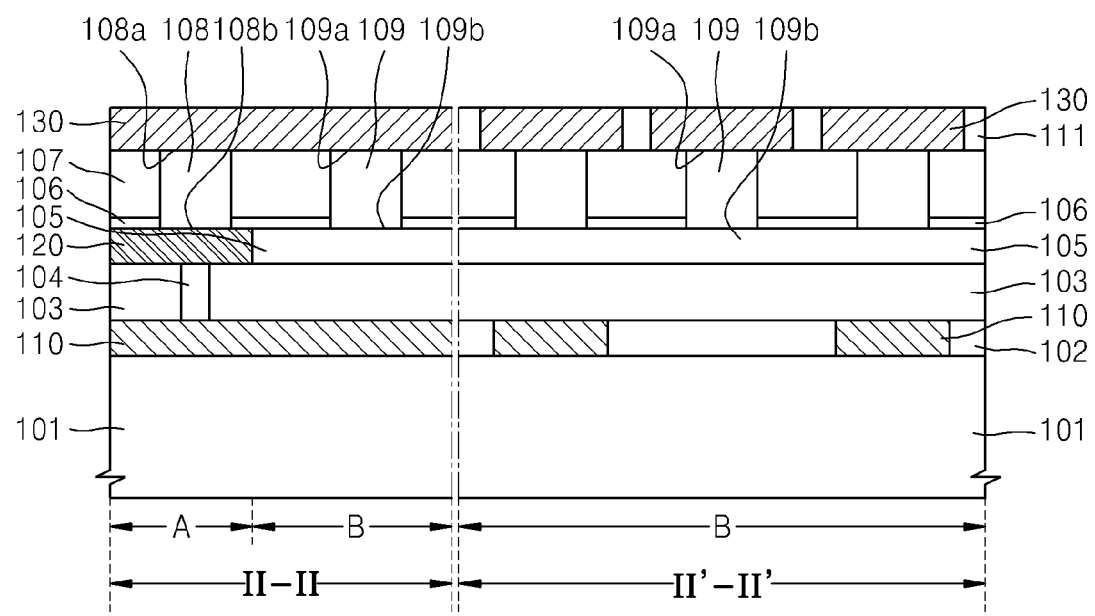

Referring to FIG. 6E, the second interconnections 130 may be formed on the intermetallic dielectric layer 107. The second interconnections 130 may be formed in a method similar to the method of forming the first interconnections 120, as described above, and is not described again here.

Figure 7:
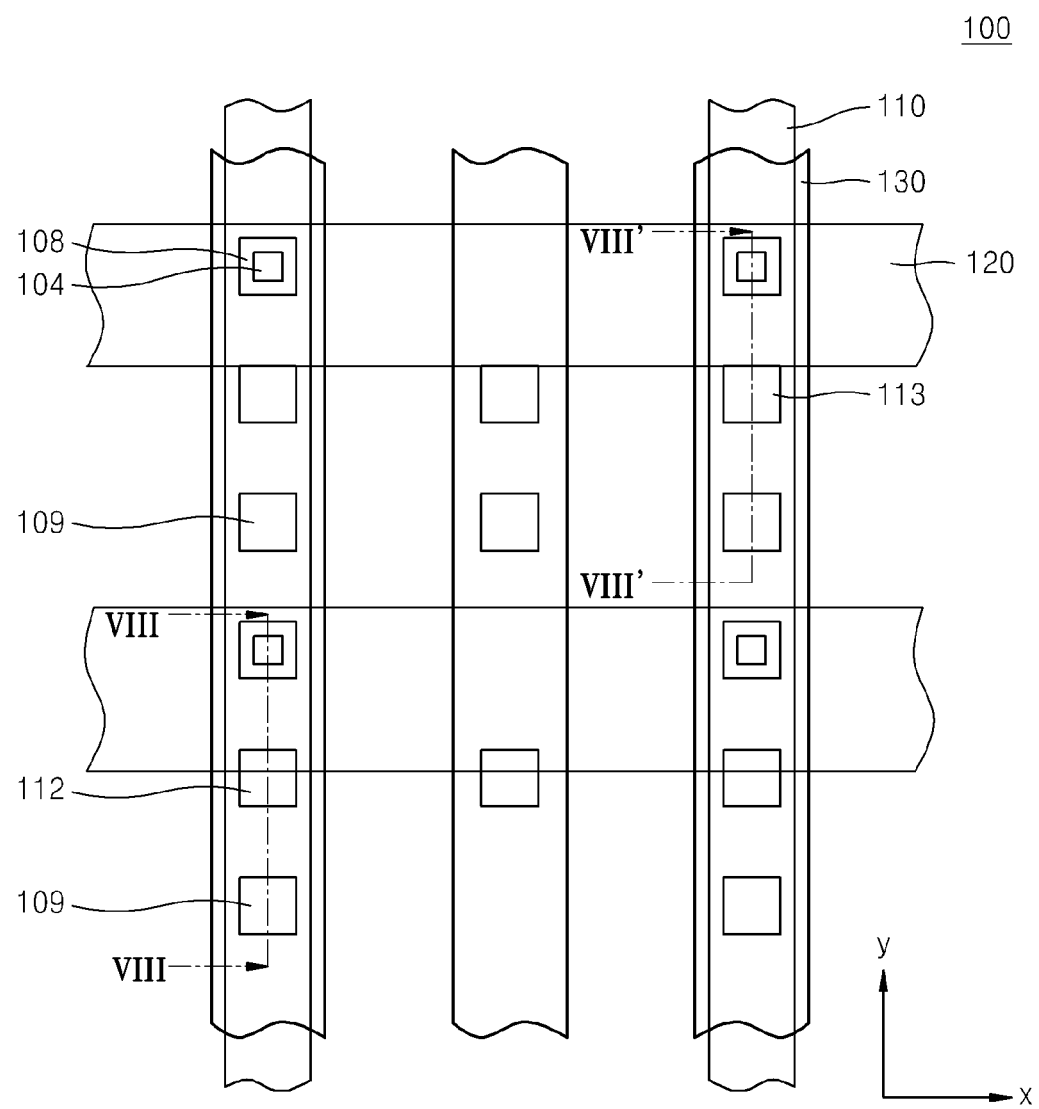
FIG. 7 is a conceptual diagram illustrating a layout of a part of a semiconductor device according to example embodiments of the inventive concepts.

FIG. 7 is a conceptual diagram illustrating a layout of a part of a semiconductor device 100 according to example embodiments of the inventive concepts. FIG. 7 illustrates a layout of example embodiments of the part of the semiconductor device 100 of FIG. 1, according to the inventive concepts. In FIG. 7, an arrangement of a plurality of bit lines 110, a plurality of first interconnections 120, and a plurality of second interconnections 130 is as described above and is not described again here.

Referring to FIG. 7, each of the second interconnections 130 may be connected to a second dummy plug 112 and a third dummy plug 113. The second dummy plug 112 may be disposed in a region in which each of the first interconnections 120 and the second interconnections 130 overlap each other, and the third dummy plug 113 may be disposed in a border region in which each of the first interconnections 120 and the second interconnections 130 do not overlap one another. In other words, the second dummy plug 112 may be disposed in a border region between each of the first interconnections 120 and a first interconnection dielectric layer (not shown), and the third dummy plug 113 may be disposed in a region where the first interconnection dielectric layer and each of the second interconnections 130 overlap each other.

Figure 8A:
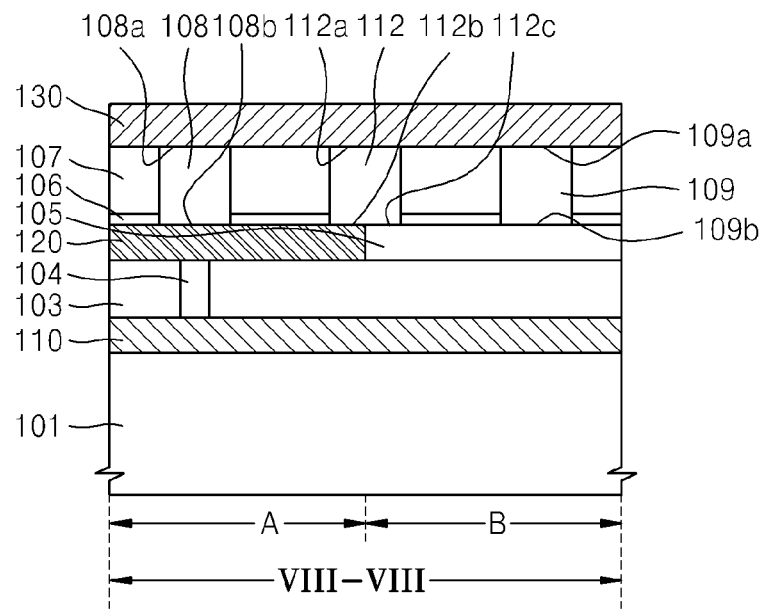
FIGS. 8A and 8B are side cross-sectional views taken along line VIII-VIII of FIG. 7.
Figure 8B:
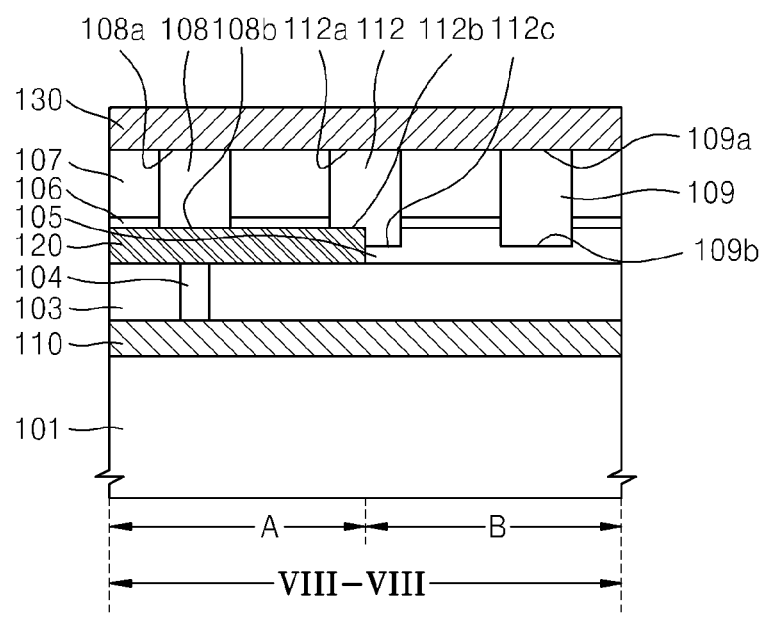
Figure 8C:
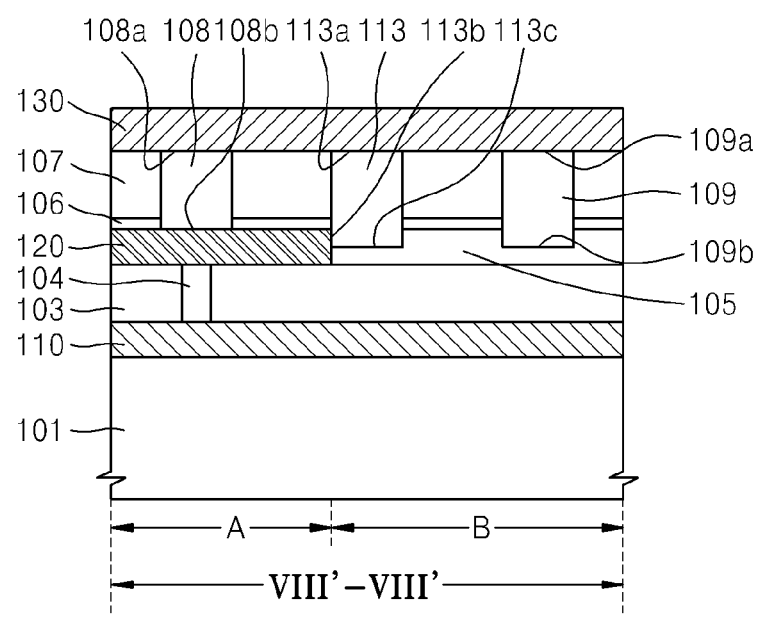
FIG. 8C is a side cross-sectional view taken along line VIII'-VIII' of FIG. 7.

FIGS. 8A and 8B are side cross-sectional views taken along line VIII-VIII of FIG. 7. FIG. 8C is a side cross-sectional view taken along line VIII'-VIII' of FIG. 7. Specifically, in FIGS. 8A and 8B, the parts indicated by the line VIII-VIII are cross-sectional views obtained when the semiconductor device 100 of FIG. 7 is cut in the y-axis direction. In FIG. 8C, the part indicated by the line VIII'-VIII' is a cross-sectional view obtained when the semiconductor device 100 is also cut in the y-axis direction. The elements of the semiconductor device 100, except for the second dummy plug 112 and the third dummy plug 113, are as described above and are not described again here.

Referring to FIGS. 7 and 8A, the semiconductor device 100 may include the second dummy plug 112 disposed in the intermetallic dielectric layer 107 in a border region between a region (first region A) in which the first interconnection 120 overlaps the second interconnection 130 and a region (second region B) in which the first interconnection 120 does not overlap the second interconnection 130. Specifically, the second dummy plug 112 may stretch over both the first region A and the second region B. In example embodiments, a bottom surface of the second dummy plug 112 may be disposed on a plane where a bottom surface 108b of a plug 108 and a bottom surface 109b of a first dummy plug 109 are disposed. Thus, the bottom surface of the second dummy plug 112 may be divided into a contact surface 112b that contacts the first interconnections 120 and a non-contact surface 112c that does not contact the first interconnections 120. The non-contact surface 112c of the second dummy plug 112 may contact a top surface of a first interconnection dielectric layer 105. The top surface 112a of the second dummy plug 112 may contact a bottom surface of one of the second interconnections 130.

Referring to FIGS. 7 and 8B, according to example embodiments of the inventive concepts, the contact surface 112b of the second dummy plug 112 may contact a side surface and a top surface of one of the first interconnections 120, and the non-contact surface 112c may be higher than a bottom surface of one of the first interconnections 120 with respect to the semiconductor layer 101. In other words, the non-contact surface 112c of the second dummy plug 112 may be embedded in the first interconnection dielectric layer 105. Otherwise, the non-contact surface 112c of the second dummy plug 112 may be flush with the bottom surface of one of the first interconnections 120. The top surface 112a of the second dummy plug 112 may contact a bottom surface of one of the second interconnections 130.

Referring to FIGS. 7 and 8C, the semiconductor device 100 may include the third dummy plug 113 that is not only included in the second region B but also borders the first region A, unlike the second dummy plug 112 stretching over both the first and second regions A and B. In example embodiments, a side surface 113b of the third dummy plug 113 may contact a side surface of one of the first interconnections 120, and a bottom surface 113c of the third dummy plug 113 may extend to pass through a diffusion barrier layer 106 and thus be exposed from the diffusion barrier layer 106. The bottom surface 113c of the third dummy plug 113 may be higher than the bottom surface of one of the first interconnections 120 with respect to the semiconductor layer 101. That is, the bottom surface 113c of the third dummy plug 113 may be embedded in the first interconnection dielectric layer 105. Otherwise, the bottom surface 113c of the third dummy plug 113 may be flush with the bottom surface of one of the first interconnections 120, or may be lower than the bottom surface of one of the first interconnections 120 with respect to the semiconductor layer 101. The top surface 113a of the third dummy plug 113 may contact a bottom surface of one of the second interconnections 130.

The second dummy plug 112 illustrated in FIGS. 8A and 8B and the third dummy plug 113 illustrated in FIG. 8C may be formed according to the method of forming the plug 108 and the first dummy plug 109 described above. The second dummy plug 112 and the third dummy plug 113 may each have a surface exposed from the diffusion barrier layer 106, and may thus provide a moving path of hydrogen gas $H_2$ similar to the first dummy plug 109. Thus, the semiconductor device 100 is capable of improving the efficiency of an alloy process and may thus have improved electrical characteristics. In particular, when the semiconductor device 100 has a complicated design, the second dummy plug 112 and the third dummy plug 113 may be useful in securing the moving path of hydrogen gas $H_2$.

Figure 9:
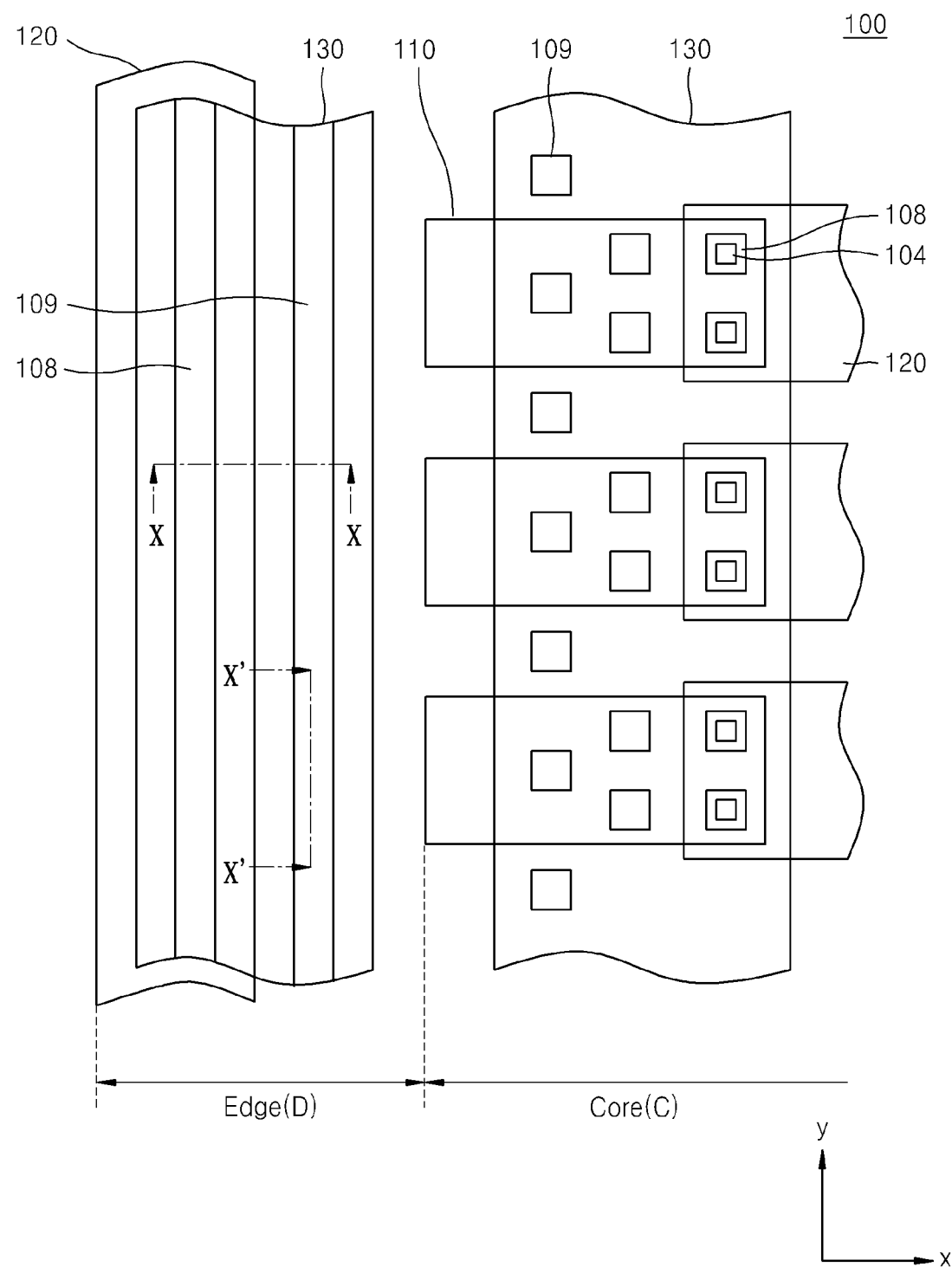
FIG. 9 is a conceptual diagram illustrating a layout of a part of a semiconductor device according to example embodiments of the inventive concepts.

FIG. 9 is a conceptual diagram illustrating a layout of a part of a semiconductor device 100 according to example embodiments of the inventive concepts. FIG. 9 is a layout diagram of another part of the semiconductor device 100 of FIG. 1, according to example embodiments of the inventive concepts. Specifically, FIG. 9 illustrates an arrangement of, for example, a plurality of bit lines 110, a plurality of first interconnections 120, and a plurality of second interconnections 130 formed on a semiconductor layer (not shown) in a core area C and an edge area D of the semiconductor device 100.

Referring to FIG. 9, in the core area C, the bit lines 110 extend on the semiconductor layer in a second direction (x-axis direction) and may be aligned with one another in a first direction (y-axis direction). The bit lines 110 may be electrically connected to unit devices (not shown) included in the semiconductor layer via a direct contact plug (not shown). Also, in the core area C, the first interconnections 120 may extend in the second direction and may be aligned with one another in the first direction. The first interconnections 120 may be electrically connected to the bit lines 110 via a bit line contact plug 104 therebetween. The bit line contact plug 104 may be disposed at an intersection of each of the first interconnections 120 and the bit lines 110. The second interconnections 130 may extend in the first direction, and may be electrically connected to the first interconnections 120 via a plug 108 therebetween. Also, each of the second interconnections 130 may be connected to a first dummy plug 109. The first dummy plug 109 may be disposed in a region where one of the second interconnections 130 and one of the first interconnections 120 do not overlap each other.

In an edge area D, the bit lines 110 may not be formed, and the first interconnections 120 and the second interconnections 130 may extend in the first direction. The first interconnections 120 and the second interconnections 130 may be electrically connected to one another via the plug 108 therebetween in a region where each of the first interconnections 120 and the second interconnections 130 overlap each other. The first dummy plug 109 may be connected to each of the second interconnections 130 in a region where each of the first interconnections 120 and the second interconnections 130 do not overlap each other.

Figure 10:
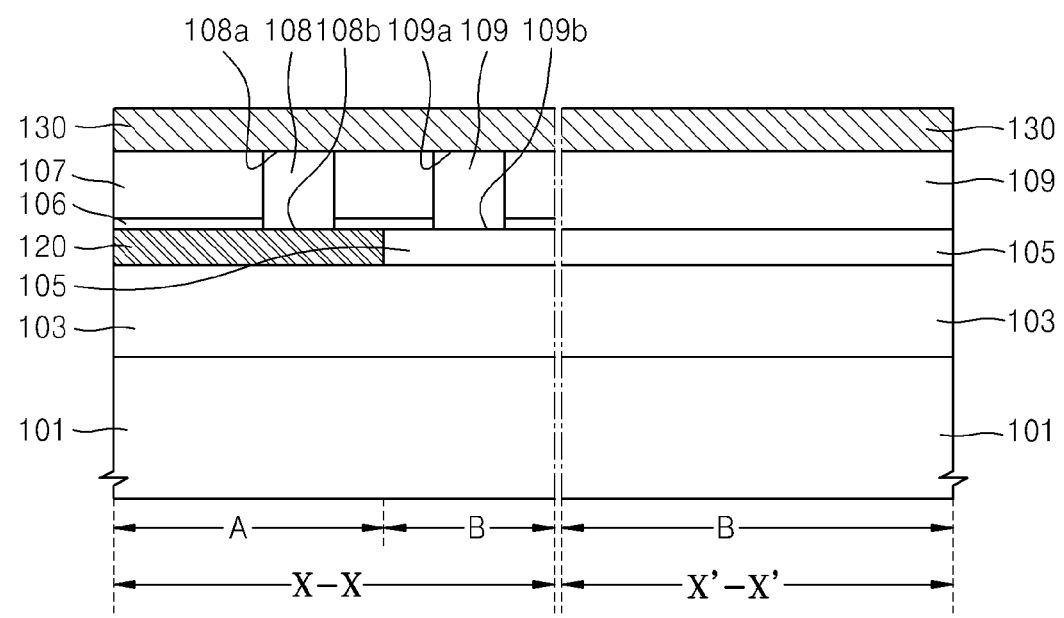
FIG. 10 is a side cross-sectional view taken along lines X-X and X'-X' of FIG. 9.

FIG. 10 is a side cross-sectional view taken along lines X-X and X'-X' of FIG. 9. In FIG. 10, the part indicated by the line X-X is a cross-sectional view obtained when the semiconductor device 100 is cut in the x-axis direction in the edge area D, and the part indicated by the line X'-X' is a cross-sectional view obtained when the semiconductor device 100 is cut in the y-axis direction in the edge area D. Elements formed in the core area C are as described above with reference to FIGS. 1 and 2. The semiconductor device 100 will now be described focusing on the plug 108 and the first dummy plug 109 formed in the edge area D.

Referring to FIGS. 9 and 10, in the edge area D, the plug 108 may be disposed in an intermetallic dielectric layer 107 in a region (first region A) where each of the first interconnections 120 overlaps with one of the second interconnections 130. The plug 108 may have a top surface 108a contacting a bottom surface of each of the second interconnections 130 and may extend to pass through the intermetallic dielectric layer 107 and a diffusion barrier layer 106. Thus, a bottom surface 108b of the plug 108 may contact a top surface of each of the first interconnections 120. In the edge area D, the first dummy plug 109 may be disposed in the intermetallic dielectric layer 107 in a region (second region B) where each of the first interconnections 120 does not overlap with one of the second interconnections 130. The first dummy plug 109 may have a top surface 109a contacting a bottom surface of each of the second interconnections 130 and may extend to pass through the intermetallic dielectric layer 107 and the diffusion barrier layer 106. Thus, a bottom surface 109b of the first dummy plug 109 may contact a top surface of a first interconnection dielectric layer 105.

In the edge area D, the plug 108 and the first dummy plug 109 may be each formed in a line shape extending in a horizontal direction. In other words, the plug 108 and the first dummy plug 109 may extend in the first direction in which the first interconnections 120 and the second interconnections 130 extend. Because the bottom surface 109b of the first dummy plug 109 having the line shape exposed from the diffusion barrier layer 106, a moving path of hydrogen gas $H_2$ may be provided. Thus, the semiconductor device 100 is capable of improving the efficiency of an alloy process and may thus have improved electrical characteristics.

As described above, in the edge area D, the first dummy plug 109 may be embedded in the first interconnection dielectric layer 105 and the interlayer dielectric layer 103, and may further extend to be embedded in the semiconductor layer 101. Also, in the edge area D, not only the first dummy plug 109 but also either the second dummy plug 112 (see FIGS. 7, 8A, and 8B) or the third dummy plug 113 (see FIGS. 7 and 8C) are formed in the border region between the first and second regions A and B in a line shape extending in the first direction.

Figure 11:
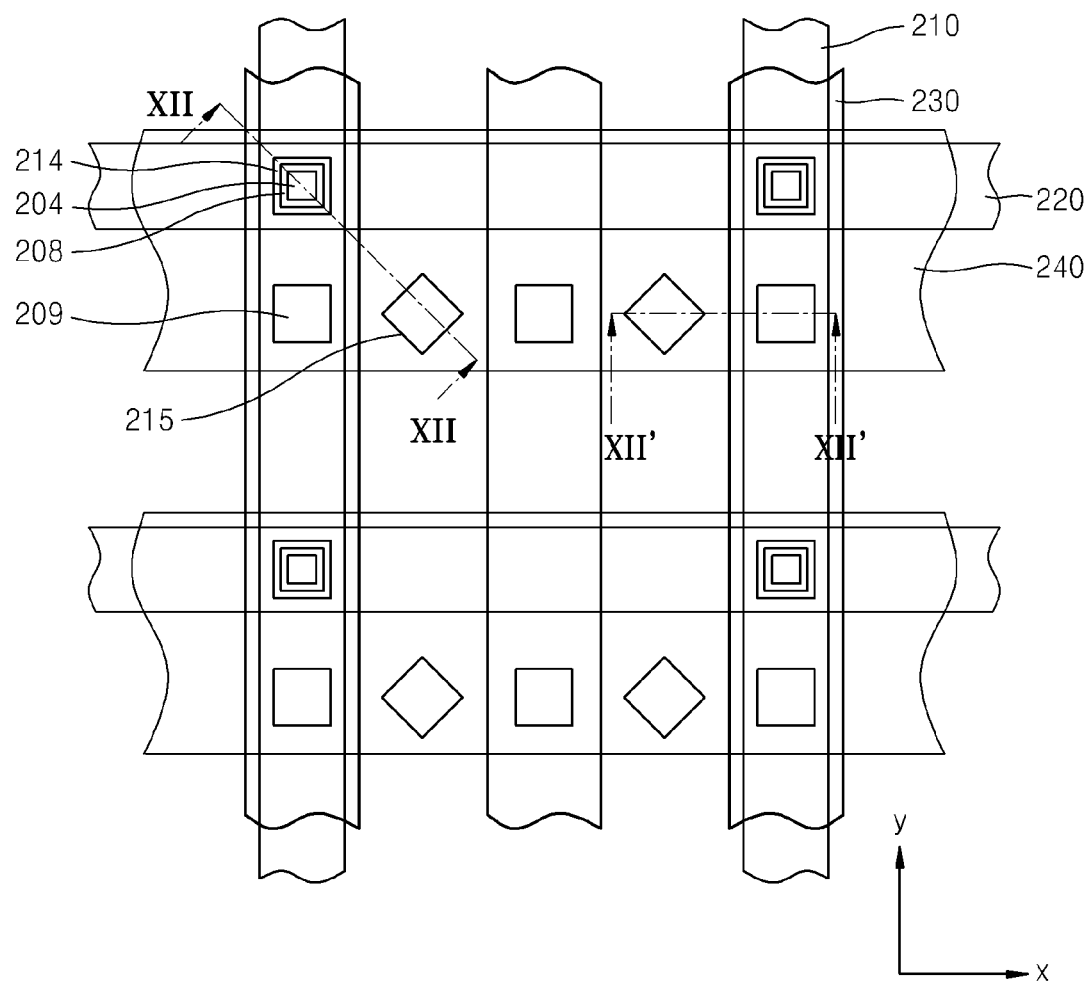
FIG. 11 is a conceptual diagram illustrating a layout of a part of a semiconductor device according to example embodiments of the inventive concepts.

FIG. 11 is a conceptual diagram illustrating a layout of a part of a semiconductor device 200 according to example embodiments of the inventive concepts. The semiconductor device 200 of FIG. 11 further includes a plurality of third interconnections 240, compared to the semiconductor device 100 of FIG. 1. In FIG. 11, a plurality of bit lines 210, a plurality of first interconnections 220, a plurality of second interconnections 230, a bit line contact plug 204, a first plug 208, and a first dummy plug 209 are the same as those illustrated in FIG. 1 and are not described again here.

Referring to FIG. 11, the bit lines 210, the first interconnections 220, and the second interconnections 230 are sequentially formed on a semiconductor layer (not shown). The third interconnections 240 may extend on the second interconnections 230 and a second interconnection dielectric layer (not shown) in a second direction (x-axis direction), and may be aligned with one another in a first direction (y-axis direction). The third interconnections 240 may be electrically connected to the second interconnections 230 via a second plug 214 therebetween. The second plugs 214 may be disposed at intersections of the second interconnections 230, the first interconnections 220, and the bit lines 210. For example, the second plug 214 may be disposed at a location corresponding to a location of the bit line contact plug 204 and the first plug 208.

The third interconnections 240 may be connected to second dummy plugs 215. The second dummy plugs 215 may be disposed in regions where the third interconnections 240, the second interconnections 230, and the first interconnections 220 do not overlap one another. That is, the second dummy plugs 215 may be disposed in regions where a first interconnection dielectric layer (not shown) that separates the first interconnections 220 from one another, the second interconnection dielectric layer that separates the second interconnections 230 from one another, and the third interconnections 240 overlap with one another.

Figure 12:
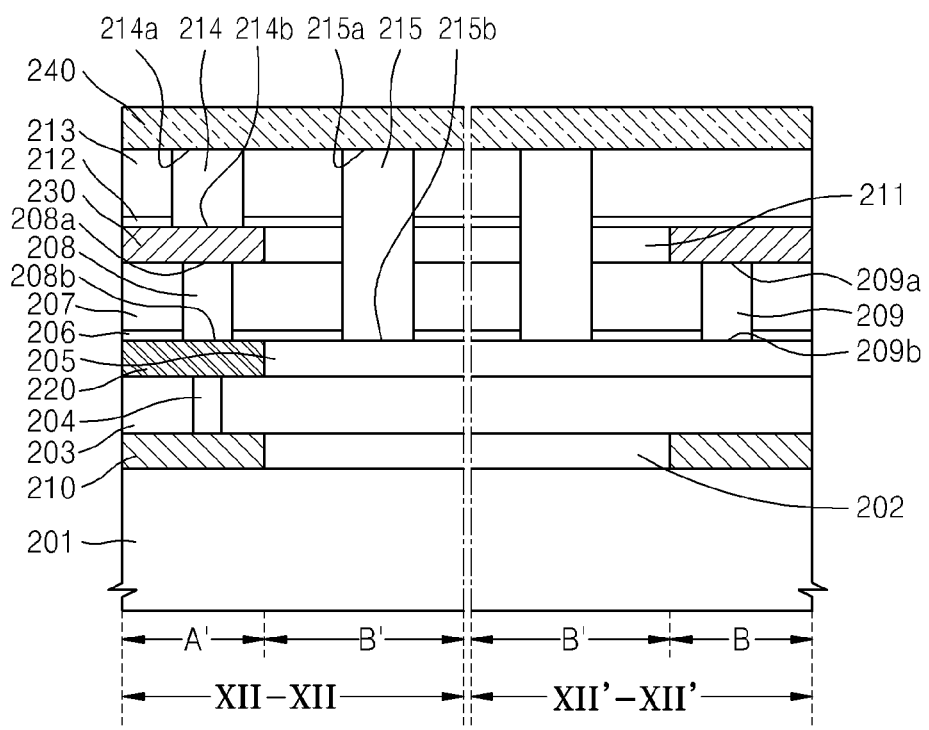
FIG. 12 is a side cross-sectional view taken along lines XII-XII and XII'-XII' of FIG. 11.

FIG. 12 is a side cross-sectional view taken along lines XII-XII and XII'-XII' of FIG. 11. In FIG. 11, the part indicated by the line XII-XII is a cross-sectional view obtained when the semiconductor device 200 is cut at an angle of 45 degrees in the y-axis direction, and the part indicated by the line XII'-XII' is a cross-sectional view obtained when the semiconductor device 200 is cut in the x-axis direction. The semiconductor layer 201, the bit lines 210, a bit line insulating layer 202, an interlayer dielectric layer 203, the bit line contact plug 204, the first interconnections 220, a first interconnection dielectric layer 205, a first diffusion barrier layer 206, the first plug 208, the first dummy plug 209, a first intermetallic dielectric layer 207, the second interconnections 230, and a second interconnection dielectric layer 211 are the same as those illustrated in FIGS. 1 and 2, and are not described again here.

Referring to FIGS. 11 and 12, the second diffusion barrier layer 212 may be formed on the second interconnections 230 and the second interconnection dielectric layer 211. The second diffusion barrier layer 212 may prevent or inhibit diffusion of a metallic material used to form the second interconnections 230 during manufacture of the semiconductor device 200 similar to the first diffusion barrier layer 206. The second diffusion barrier layer 212 may be formed to cover top surfaces of the second interconnections 230 and the second interconnection dielectric layer 211. Although not shown in FIG. 12, the second diffusion barrier layer 212 may be formed to cover bottom surfaces of the second interconnections 230 and the second interconnection dielectric layer 211. The second diffusion barrier layer 212 may have a single-layered structure or a multi-layered structure, and may be formed of the material used to form the first diffusion barrier layer 206.

A second intermetallic dielectric layer 213, including the second plug 214 and the second dummy plug 215, may be formed on the second diffusion barrier layer 212. The third interconnections 240 may be formed on the second intermetallic dielectric layer 213.

The second plug 214 may be disposed in the second intermetallic dielectric layer 213 in a region (first region A') where each of the first interconnections 220, the second interconnections 230, and the third interconnections 240 overlap one another. The second plug 214 may have a top surface 214a contacting the bottom surfaces of the third interconnections 240, and may extend to pass through the second intermetallic dielectric layer 213 and the second diffusion barrier layer 212. Thus, a bottom surface 214b of the second plug 214 may contact the top surfaces of the second interconnections 230. The second plug 214 may be formed of the material used to form the first plug 208. A width of the second plug 214 may be equal to or greater than that of the first plug 208.

The second dummy plug 215 may be disposed in the second intermetallic dielectric layer 217 in a region (second region B') where each of the first interconnections 220, the second interconnections 230, and the third interconnections 240 do not overlap one another. The second region B' may include all regions where the first interconnections 220 and the second interconnections 230 are not present below the second intermetallic dielectric layer 213 and where the third interconnections 240 are present on the second intermetallic dielectric layer 213 with respect to the second intermetallic dielectric layer 213. The second region B' is not limited to a region of the semiconductor device 200.

A bottom surface 215b of the second dummy plug 215 may be flush with a bottom surface 208b of the first plug 208 and a bottom surface 209b of the first dummy plug 209, and the bottom surface 215b of the second dummy plug 215 may not contact the first interconnections 220 and the second interconnections 230. That is, the second dummy plug 215 may have a top surface 215a contacting the bottom surfaces of the third interconnections 240, and may extend to pass through the second intermetallic dielectric layer 213, the second diffusion barrier layer 212, the first intermetallic dielectric layer 207, and the first diffusion barrier layer 206. Thus, the bottom surface 215b of the second dummy plug 215 may contact a top surface of the first interconnection dielectric layer 205. The second dummy plug 215 may be formed of the material used to form the second plug 214.

Although FIG. 12 illustrates that the second dummy plug 215 has the same width as the second plug 214, the inventive concepts are not limited thereto and the second dummy plug 215 may have a width different than that of the second plug 214. The second dummy plug 215 may have a cross-section having any of various shapes. Also, similar to the embodiments of FIGS. 4A and 4B, the second dummy plug 215 may further extend to pass through the first diffusion barrier layer 206 and thus be embedded in the first interconnection dielectric layer 205, the interlayer dielectric layer 203, the bit line insulating layer 202, or the semiconductor layer 201.

The semiconductor device 200 may include the second dummy plug 215 and the first dummy plug 209, which is present in the first intermetallic dielectric layer 207 in a second region B, and may further include dummy plugs (not shown) disposed in a border region between the first and second regions A' and B', similar to the embodiments of FIGS. 8A to 8C.

Thus, the semiconductor device 200 is capable of improving the efficiency of an alloy process by using the second dummy plug 215 to provide a moving path of hydrogen gas $H_2$ even when movement of hydrogen gas $H_2$ is interrupted by the first diffusion barrier layer 206 and the second diffusion barrier layer 212 during the alloy process. Thus, the electrical characteristic of the semiconductor device 200 may be improved by using the alloy process. Also, because the second dummy plug 215 secures the moving path of hydrogen gas $H_2$, high-density hydrogen gas $H_2$ does not need to be provided by changing a process temperature and pressure, thereby improving the reliability of interconnection characteristics of the semiconductor device 200. Also, the second dummy plug 215 may be formed during formation of the second plug 214 for connecting highest-level interconnections and second highest-level interconnections. Therefore, the semiconductor device 200 may be manufactured in a relatively simple manner while saving manufacturing costs thereof.

The inventive concepts may also be applied to a case where at least four layers of interconnections and an intermetallic dielectric layer are alternately formed and a diffusion barrier layer is interposed between these layers. In other words, during formation of a metal contact, a dummy plug may be formed from an uppermost diffusion barrier layer to pass through a lowermost diffusion barrier layer and a lower surface thereof may thus be exposed in a region where the interconnections do not overlap with one another. Also, the inventive concepts are not limited to a case where each of the dummy plugs according to the previous example embodiments is included in one semiconductor device. Various dummy plugs, e.g., at least one combination of the dummy plugs, according to the previous example embodiments may be included in one semiconductor device.

Figure 13:
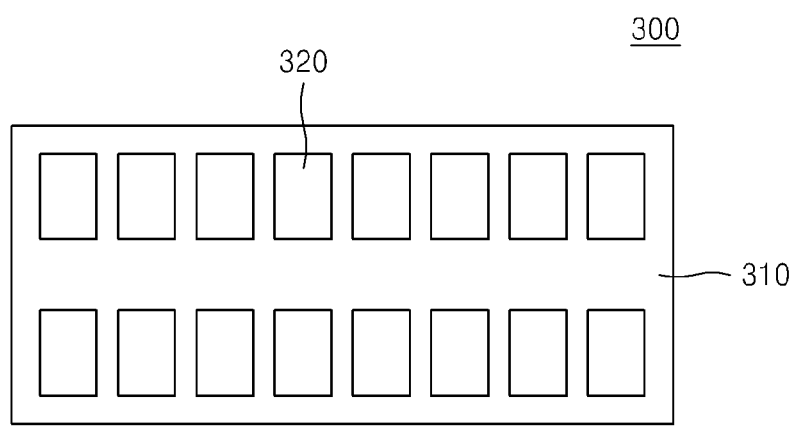
FIG. 13 is a plan view of a memory module including a semiconductor device, according to example embodiments of the inventive concepts.

FIG. 13 is a plan view of a memory module 300 including a semiconductor device, according to example embodiments of the inventive concepts. The memory module 300 may include a printed circuit board 310 and a plurality of semiconductor packages 320.

The plurality of semiconductor packages 320 may include semiconductor devices according to various example embodiments of the inventive concepts. In particular, the plurality of semiconductor packages 320 may include at least one semiconductor device selected from among the semiconductor devices including dummy plugs according to example embodiments of the inventive concepts.

The memory module 300 according to example embodiments may be a single in-line memory module (SIMM) in which the plurality of semiconductor packages 320 are mounted on only one surface of the printed circuit board 310, or may be a dual in-line memory module (DIMM) in which the plurality of semiconductor packages 320 are mounted on both surfaces of the printed circuit board 310. Otherwise, the memory module 300 according to example embodiments may be a fully buffered DIMM (FBDIMM) including an advanced memory buffer (AMB) for respectively supplying external signals to the plurality of semiconductor packages 320.

Figure 14:
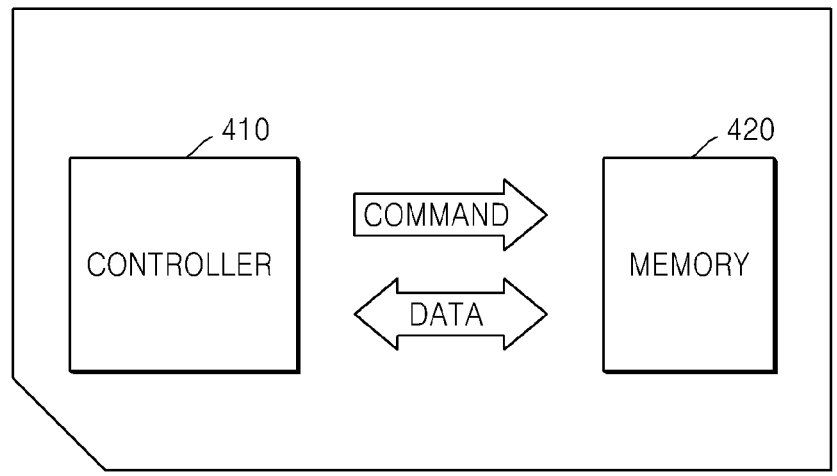
FIG. 14 is a schematic view of a memory card including a semiconductor device according to example embodiments of the inventive concepts.

FIG. 14 is a schematic view of a memory card 400 including a semiconductor device, according to example embodiments of the inventive concepts. In the memory card 400, a controller 410 and a memory 420 are disposed to exchange electrical signals with each other. For example, when the controller 410 provides a command to the memory 420, the memory 420 may transmit data to the controller 410.

The memory 420 may include a semiconductor device according to example embodiments of the inventive concepts. In particular, the memory 420 may include at least one semiconductor device selected from among the semiconductor devices including dummy plugs according to example embodiments of the inventive concepts.

Examples of the memory card 400 may include various types of cards, e.g., a memory stick card, a smart media (SM) card, a secure digital (SD) card, a mini-secure digital (mini SD) card, and a multimedia card (MMC).

Figure 15:
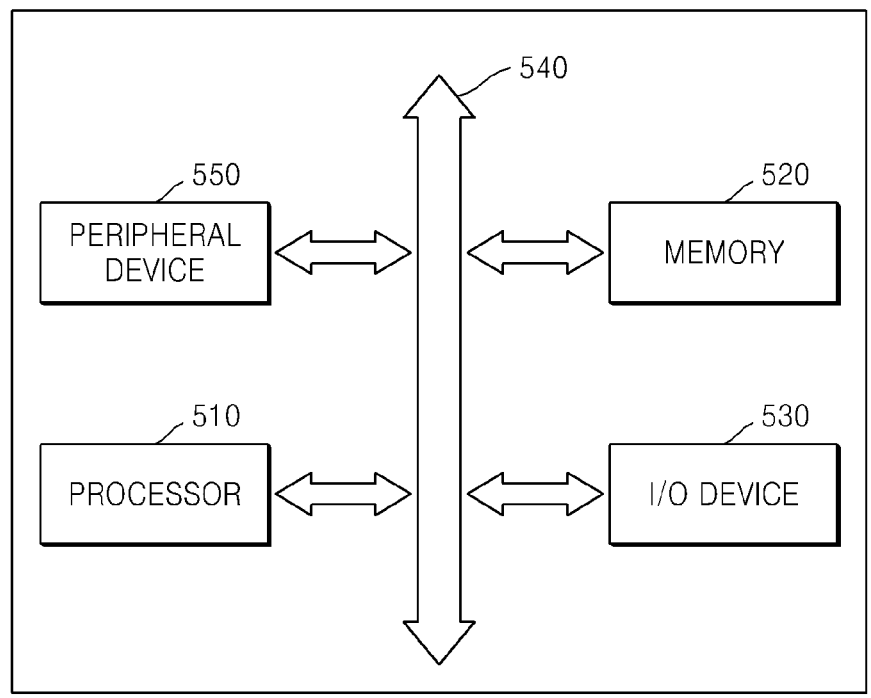
FIG. 15 is a schematic view of a system including a semiconductor device, according to example embodiments of the inventive concepts.

FIG. 15 is a schematic view of a system 500 including a semiconductor device, according to example embodiments of the inventive concepts. In the system 500, a processor 510, a memory 520, and an input/output (I/O) device 530 may establish data communication with one another via a bus 540.

In the system 500, the memory 520 may include RAM and read only memory (ROM). The system 500 may further include a peripheral device 550, e.g., a floppy disk drive and a compact disk (CD) ROM drive.

The memory 520 may include a semiconductor device according to example embodiments of the inventive concepts. In particular, the memory 520 may include at least one semiconductor device selected from among the semiconductor devices including dummy plugs according to example embodiments of the inventive concepts.

The memory 520 may store code and data for operating the processor 510. The system 500 may be used in a mobile phone, an MP3 player, a navigation device, a portable multimedia player (PMP), a solid state disk (SSD), or household appliances.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
   a semiconductor layer including at least one unit device;
   a first interconnection on the semiconductor layer, the first interconnection electrically connected to the at least one unit device;
   a diffusion barrier layer on the first interconnection;
   an intermetallic dielectric layer on the diffusion barrier layer;
   a second interconnection on the intermetallic dielectric layer;
   a plug in a first region of the intermetallic dielectric layer, the plug passing through the diffusion barrier layer so that a bottom surface thereof contacts the first interconnection; and
   a plurality of first dummy plugs in a second region of the intermetallic dielectric layer, each of the plurality of first dummy plugs having a top surface contacting the second interconnection and a bottom surface passing through the diffusion barrier layer and not contacting the first interconnection.

2. The semiconductor device of claim 1,
   wherein:
   the second interconnection contacts a top surface of the plug,
   the first and second interconnections overlap each other in a vertical direction in the first region of the intermetallic dielectric layer when viewed from a cross-sectional view, and
   the first and second interconnections do not overlap each other in the second region of the intermetallic dielectric layer.

3. The semiconductor device of claim 1, wherein the plurality of first dummy plugs provides a moving path of hydrogen gas supplied from an external environment to the semiconductor layer.

4. The semiconductor device of claim 1, wherein the bottom surface of the plurality of first dummy plugs is flush with the bottom surface of the plug.

5. The semiconductor device of claim 1, wherein the bottom surface of the plurality of first dummy plum is lower than the bottom surface of the plug and is higher than a bottom surface of the first interconnection with respect to the semiconductor layer.

6. The semiconductor device of claim 1, wherein the bottom surface of the plurality of first dummy plugs is lower than a bottom surface of the first interconnection with respect to the semiconductor layer.

7. The semiconductor device of claim 1, further comprising:
   a second dummy plug in a border region between the first and second regions of the intermetallic dielectric layer, the second dummy plug passing through the diffusion barrier layer,
   wherein a bottom surface of the second dummy plug is divided into a contact surface that contacts the first interconnection and a non-contact surface that does not contact the first interconnection.

8. The semiconductor device of claim 7, wherein the contact surface and the non-contact surface of the second dummy plug are flush with a top surface of the first interconnection.

9. The semiconductor device of claim 7, wherein the contact surface of the second dummy plug contacts top and side surfaces of the first interconnection, and
   the non-contact surface of the second dummy plug is higher than a bottom surface of the first interconnection with respect to the semiconductor layer.

10. The semiconductor device of claim 1, further comprising:
    a third dummy plug in a border region between the first and second regions of the intermetallic dielectric layer, the third dummy plug passing through the diffusion barrier layer,
    wherein a bottom surface of the third dummy plug is exposed and a side surface of the third dummy plug contacting a side surface of the first interconnection.

11. The semiconductor device of claim 1, wherein the plurality of first dummy plugs includes a material used to form the plug.

12. The semiconductor device of claim 1, wherein the plurality of first dummy plugs include a cross-section having one of a circular, oval, and polygonal shape.

13. The semiconductor device of claim 1, wherein the plurality of first dummy plugs are formed in a line shape extending in a horizontal direction.

14. The semiconductor device of claim 1, wherein the bottom surface of the plurality of first dummy plugs is exposed.

15. The semiconductor device of claim 1, wherein the plurality of first dummy plugs are separately formed on the semiconductor layer by an interval only on one side of the plug.

16. A semiconductor device comprising:
    a first interconnection on a semiconductor layer;
    a diffusion barrier layer on the first interconnection;
    an intermetallic dielectric layer on the diffusion barrier layer;
    a plug in a first region of the intermetallic dielectric layer, the plug passing through the diffusion barrier layer so that a bottom surface thereof contacts the first interconnection; and
    a plurality of first dummy plugs in a second region of the intermetallic dielectric layer, the plurality of first dummy plugs being spaced apart by an interval only on one side of the plug.

17. The semiconductor device of claim 16, further comprising:
    a second interconnection on the intermetallic dielectric layer, the second interconnection contacting a top surface of the plug and a top surface of the first dummy plug,
    wherein the first and second interconnections overlap each other in a vertical direction in the first region of the intermetallic dielectric layer when viewed from a cross-sectional view, and the first and second interconnections do not overlap each other in the second region of the intermetallic dielectric layer.

18. The semiconductor device of claim 17, further comprising:
    a second dummy plug in a border region between the first and second regions of the intermetallic dielectric layer, the second dummy plug passing through the diffusion barrier layer,
    wherein a bottom surface of the second dummy plug is divided into a contact surface that contacts the first interconnection and a non-contact surface that does not contact the first interconnection.

19. The semiconductor device of claim 18, wherein the contact surface and the non-contact surface of the second dummy plug are flush with a top surface of the first interconnection.

20. The semiconductor device of claim 18, wherein the contact surface of the second dummy plug contacts top and side surfaces of the first interconnection, and the non-contact surface of the second dummy plug is higher than a bottom surface of the first interconnection with respect to the semiconductor layer.

21. The semiconductor device of claim 17, wherein:

the at least one first dummy plug is a plurality of first dummy plugs, the bottom surface of each of the plurality of first dummy plugs does not contact the first interconnection, and each of the plurality of first dummy plugs has a top surface contacting the second interconnection.

22. The semiconductor device of claim 16, wherein the plurality of first dummy plugs pass through the diffusion barrier layer so that a bottom surface of the plurality of first dummy plugs is exposed.

* * * * *